United States Patent
Zettel et al.

(10) Patent No.: US 8,005,632 B2
(45) Date of Patent: Aug. 23, 2011

(54) METHOD AND APPARATUS FOR DETECTING FAULTS IN A CURRENT SENSING DEVICE

(75) Inventors: Andrew M. Zettel, Ann Arbor, MI (US); Jayanthi Padmanabhan, Troy, MI (US); Michael J. Miller, Macomb, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 272 days.

(21) Appl. No.: 11/936,291

(22) Filed: Nov. 7, 2007

(65) Prior Publication Data
US 2009/0144002 A1    Jun. 4, 2009

(51) Int. Cl.
*G01R 19/00*    (2006.01)
(52) U.S. Cl. ............. 702/64; 702/57; 702/117; 702/127
(58) Field of Classification Search .................... 702/59, 702/64–65
See application file for complete search history.

(56) References Cited

U.S. PATENT DOCUMENTS

| | | | |
|---|---|---|---|
| 4,021,718 A * | 5/1977 | Konrad | 340/636.16 |
| 4,118,597 A * | 10/1978 | Proctor et al. | 379/378 |
| 5,563,496 A * | 10/1996 | McClure | 320/128 |
| 5,670,861 A * | 9/1997 | Nor | 320/118 |
| 5,789,325 A * | 8/1998 | Chandra et al. | 438/781 |
| 6,573,688 B2 * | 6/2003 | Nakanishi | 320/135 |
| 6,832,148 B1 | 12/2004 | Bennett | |
| 6,868,318 B1 | 3/2005 | Cawthorne | |
| 6,906,442 B2 * | 6/2005 | Yamaguchi | 310/156.43 |
| 7,005,859 B2 * | 2/2006 | Knecht | 324/522 |
| 7,154,236 B1 | 12/2006 | Heap | |
| 2003/0102871 A1 * | 6/2003 | Yudahira | 324/434 |
| 2004/0260491 A1 | 12/2004 | Tate, Jr. | |
| 2005/0076958 A1 | 4/2005 | Foster | |
| 2005/0077867 A1 | 4/2005 | Cawthorne | |
| 2005/0077877 A1 | 4/2005 | Cawthorne | |
| 2005/0080523 A1 | 4/2005 | Bennett | |
| 2005/0080527 A1 | 4/2005 | Tao | |
| 2005/0080535 A1 | 4/2005 | Steinmetz | |
| 2005/0080537 A1 | 4/2005 | Cawthorne | |
| 2005/0080538 A1 | 4/2005 | Hubbard | |
| 2005/0080539 A1 | 4/2005 | Hubbard | |
| 2005/0080540 A1 | 4/2005 | Steinmetz | |

(Continued)

FOREIGN PATENT DOCUMENTS
CN    2589997 Y    12/2003
(Continued)

OTHER PUBLICATIONS

Cummings et al., Recent Trends in Hall Effect Current Sensing, Allegro MicroSystems Inc., 2006, pp. 1-7.*

*Primary Examiner* — Drew A Dunn
*Assistant Examiner* — Mi'schita' Henson

(57) ABSTRACT

A method and article of manufacture are provided to monitor a sensing system operative to monitor electrical current in a transmission line between an electrical storage device and an electrical machine. The sensing system comprises first and second sensors, operative to monitor first and second ranges of electrical current. The method comprises determining outputs of the first and second sensors are valid, and comparing outputs of the first and second sensors when current is substantially zero. The method comprises comparing magnitudes of the outputs of the first and second sensors when the monitored electrical current, and monitoring polarity of each of the outputs of the first and second sensors.

13 Claims, 2 Drawing Sheets

U.S. PATENT DOCUMENTS

| | | |
|---|---|---|
| 2005/0080541 A1 | 4/2005 | Sah |
| 2005/0182526 A1 | 8/2005 | Hubbard |
| 2005/0182543 A1 | 8/2005 | Sah |
| 2005/0182546 A1 | 8/2005 | Hsieh |
| 2005/0182547 A1 | 8/2005 | Sah |
| 2005/0189918 A1 | 9/2005 | Weisgerber |
| 2005/0252283 A1 | 11/2005 | Heap |
| 2005/0252305 A1 | 11/2005 | Hubbard |
| 2005/0252474 A1 | 11/2005 | Sah |
| 2005/0255963 A1 | 11/2005 | Hsieh |
| 2005/0255964 A1 | 11/2005 | Heap |
| 2005/0255965 A1 | 11/2005 | Tao |
| 2005/0255966 A1 | 11/2005 | Tao |
| 2005/0255967 A1 | 11/2005 | Foster |
| 2005/0255968 A1 | 11/2005 | Sah |
| 2005/0256617 A1 | 11/2005 | Cawthorne |
| 2005/0256618 A1 | 11/2005 | Hsieh |
| 2005/0256623 A1 | 11/2005 | Hubbard |
| 2005/0256625 A1 | 11/2005 | Sah |
| 2005/0256626 A1 | 11/2005 | Hsieh |
| 2005/0256627 A1 | 11/2005 | Sah |
| 2005/0256629 A1 | 11/2005 | Tao |
| 2005/0256631 A1 | 11/2005 | Cawthorne |
| 2005/0256633 A1 | 11/2005 | Heap |
| 2005/0256919 A1 | 11/2005 | Cawthorne |
| 2005/0259371 A1 | 11/2005 | Henze et al. |
| 2006/0050910 A1 | 3/2006 | Danielsen |
| 2006/0194670 A1 | 8/2006 | Heap |
| 2007/0078580 A1 | 4/2007 | Cawthorne |
| 2007/0093953 A1 | 4/2007 | Heap |
| 2007/0149348 A1 | 6/2007 | Holmes |
| 2007/0191181 A1 | 8/2007 | Burns |
| 2007/0225886 A1 | 9/2007 | Morris |
| 2007/0225887 A1 | 9/2007 | Morris |
| 2007/0225888 A1 | 9/2007 | Morris |
| 2007/0225889 A1 | 9/2007 | Morris |
| 2007/0260381 A1 | 11/2007 | Sah |
| 2007/0276569 A1 | 11/2007 | Sah |
| 2007/0284162 A1 | 12/2007 | Zettel |
| 2007/0284163 A1 | 12/2007 | Heap |
| 2007/0284176 A1 | 12/2007 | Sah |
| 2007/0285059 A1 | 12/2007 | Zettel |
| 2007/0285060 A1 | 12/2007 | Zettel |
| 2007/0285061 A1 | 12/2007 | Zettel |
| 2007/0285063 A1 | 12/2007 | Zettel |
| 2007/0285097 A1 | 12/2007 | Zettel |
| 2008/0004779 A1 | 1/2008 | Sah |
| 2008/0028879 A1 | 2/2008 | Robinette |
| 2008/0032855 A1 | 2/2008 | Sah |
| 2008/0064559 A1 | 3/2008 | Cawthorne |
| 2008/0064562 A1 | 3/2008 | Zettel |
| 2008/0103003 A1 | 5/2008 | Sah |
| 2008/0119320 A1 | 5/2008 | Wu |
| 2008/0119321 A1 | 5/2008 | Heap |
| 2008/0120000 A1 | 5/2008 | Heap |
| 2008/0120001 A1 | 5/2008 | Heap |
| 2008/0120002 A1 | 5/2008 | Heap |
| 2008/0176706 A1 | 7/2008 | Wu |
| 2008/0176709 A1 | 7/2008 | Wu |
| 2008/0181280 A1 | 7/2008 | Wang |
| 2008/0182696 A1 | 7/2008 | Sah |
| 2008/0183372 A1 | 7/2008 | Snyder |
| 2008/0234097 A1 | 9/2008 | Sah |
| 2008/0236921 A1 | 10/2008 | Huseman |
| 2008/0243346 A1 | 10/2008 | Huseman |
| 2008/0249745 A1 | 10/2008 | Heap |
| 2008/0262694 A1 | 10/2008 | Heap |
| 2008/0262698 A1 | 10/2008 | Lahti |
| 2008/0272717 A1 | 11/2008 | Gleason |
| 2008/0275611 A1 | 11/2008 | Snyder |
| 2008/0275624 A1 | 11/2008 | Snyder |
| 2008/0275625 A1 | 11/2008 | Snyder |
| 2008/0287255 A1 | 11/2008 | Snyder |
| 2009/0069148 A1 | 3/2009 | Heap |
| 2009/0069989 A1 | 3/2009 | Heap |
| 2009/0070019 A1 | 3/2009 | Heap |
| 2009/0082170 A1 | 3/2009 | Heap |
| 2009/0088294 A1 | 4/2009 | West |
| 2009/0112412 A1 | 4/2009 | Cawthorne |
| 2009/0118917 A1 | 5/2009 | Sah |

FOREIGN PATENT DOCUMENTS

| | | |
|---|---|---|
| CN | 1537234 A | 10/2004 |

* cited by examiner

US 8,005,632 B2

METHOD AND APPARATUS FOR DETECTING FAULTS IN A CURRENT SENSING DEVICE

TECHNICAL FIELD

This disclosure is related to electrical current sensing systems.

BACKGROUND

Electric and hybrid powertrain architectures utilize electric machines to generate motive torque transmitted to a vehicle driveline. The electrical machines are operatively connected to an electrical energy storage device for interchanging electrical power therebetween. The electrical machines are further operable to transform vehicle kinetic energy, transmitted through the vehicle driveline, to electrical energy potential that is storable in the electrical energy storage device. A control system monitors various inputs from the vehicle and the operator and provides operational control of the powertrain system including controlling the torque-generative devices and regulating the electrical power interchange between the electrical energy storage device and the electrical machines.

Vehicles employing such powertrain architectures benefit from a robust method to determine a state-of-charge of the electrical energy storage device, in that operation and management of the powertrain system can be optimized based thereon. Determining a parametric value for state-of-charge requires an accurate determination of electrical current flow in and out of the electrical energy storage device. However, current flow can range from under 1.0 ampere to as high as 300 amperes in an integrated electrical energy storage device operative to supply electrical power to electrical torque-generative machines and meet other electrical needs in the vehicle. Therefore, it is beneficial to have an electrical current monitoring device that is accurate over the range of operation.

A fault occurring in the electrical current monitoring device leads to the system not operating as intended, resulting in customer dissatisfaction. Furthermore, state and federal regulations impose requirements to monitor operation of devices such as the electrical current monitoring device, including diagnosing presence of a fault and informing a vehicle operator of the presence of the fault, under regulated conditions. Monitoring conditions can include presence of open or short circuits, out-of-range/rationality checking, and proper functional response to inputs.

SUMMARY

A method and article of manufacture monitor electrical current in a transmission line between an electrical storage device and an electrical machine. The sensing system includes a first sensor operative to monitor a first range of electrical current and a second sensor operative to monitor a second range of electrical current. The method includes determining outputs of the first and second sensors are valid, and comparing outputs of the first and second sensors when current in the transmission line is substantially zero. The method also includes comparing magnitudes of the outputs of the first and second sensors when the monitored electrical current is within a monitoring range common to the first and the second sensors, and monitoring polarity of each of the outputs of the first and second sensors.

BRIEF DESCRIPTION OF THE DRAWINGS

One or more embodiments will now be described, by way of example, with reference to the accompanying drawings, in which.

DETAILED DESCRIPTION

Figure 1:
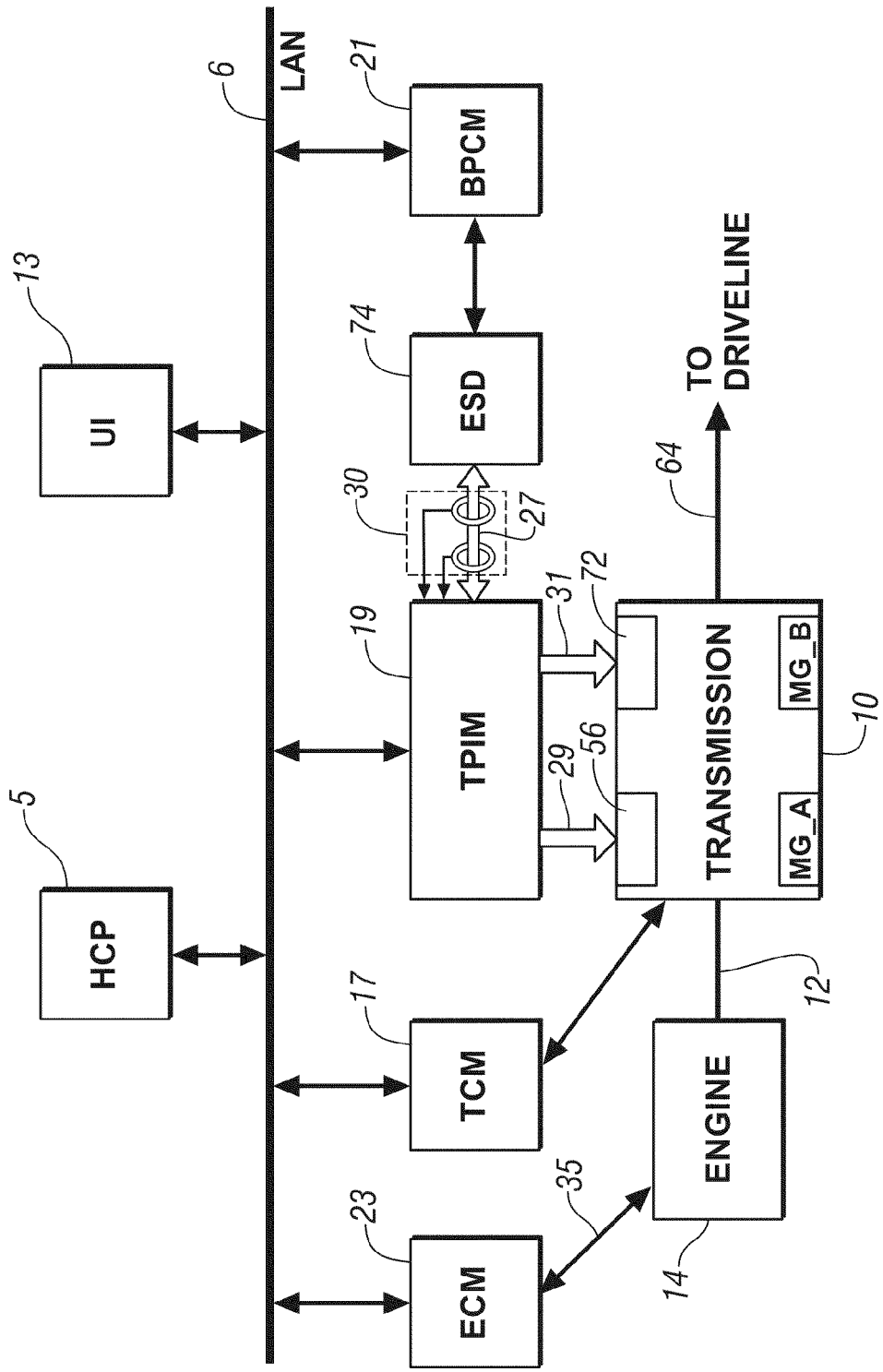
FIG. 1 is a schematic diagram of an exemplary architecture for a control system for a powertrain, in accordance with the present disclosure; and, FIG. 2 is a logic flowchart, in accordance with the present disclosure.

Referring now to the drawings, wherein the showings are for the purpose of illustrating certain exemplary embodiments only and not for the purpose of limiting the same, FIG. 1 depicts a schematic drawing of a system comprising an engine 14 connected via shaft 12 to electrically variable transmission 10, which is connected via shaft 64 to a driveline, and distributed control module system, which has been constructed in accordance with an embodiment of the present disclosure. The engine 14 preferably comprises a conventional internal combustion engine with engine control module ('ECM') 23 operably connected. The ECM 23 functions to acquire data from a variety of sensors and control a variety of actuators, respectively, of the engine 14 over a plurality of discrete lines collectively shown as aggregate line 35.

The exemplary transmission preferably comprises a two-mode, compound-split, electro-mechanical hybrid transmission including a compound planetary gear arrangement and four torque-transmitting clutches controlled by an electro-hydraulic control system. The transmission control module ('TCM') 17 is operably connected to the transmission 10 and functions to acquire data from a variety of sensors and provide command signals to the electro-hydraulic control system of the transmission. The transmission incorporates a pair of electrical machines 56, 72 which comprise motor/generator devices, and are referred to as MG-A 56 and MG-B 72. The transmission 10 receives input motive torque from the torque-generative devices, including the engine 14 and the MG-A 56 and MG-B 72, as a result of energy conversion from fuel, or from electrical potential stored in an electrical energy storage device ('ESD') 74. The ESD 74 typically comprises one or more batteries capable of storing and transmitting high electrical power levels. Other electrical energy and electrochemical energy storage devices that have the ability to store electric power and dispense electric power may be used in place of the batteries without altering the concepts of the present disclosure. The ESD 74 is preferably sized based upon factors including regenerative requirements, application issues related to typical road grade and temperature, and propulsion requirements such as emissions, power assist and electric range. The ESD 74 is high voltage DC-coupled to transmission power inverter module ('TPIM') 19 via electrical transmission line 27.

The TPIM 19 is operable to generate torque commands for MG-A 56 and MG-B 72 based upon input from a hybrid control module ('HCP') 5, which is driven by operator input through User Interface ('UI') 13 and other system operating parameters. The motor torque commands for MG-A and MG-B are implemented by the control system, including the TPIM 19, to control MG-A and MG-B. The electrical energy storage device 74 is high-voltage DC-coupled to the TPIM 19 via electrical transmission line 27. Electrical current is transferable to or from the TPIM 19 in accordance with whether the ESD 74 is being charged or discharged. The TPIM 19 communicates with the first electrical machine 56 by transfer conductors 29, and the TPIM 19 similarly communicates with the second electrical machine MG-B 72 by transfer conductors 31.

TPIM 19 includes the pair of power inverters and respective motor control modules configured to receive motor control commands and control inverter states therefrom for providing motor drive or regeneration functionality. In motoring control, the respective inverter receives DC electrical current from ESD 74 via the transfer line 27 and provides AC current to the respective electrical machine, i.e. MG-A and MG-B, over transfer conductors 29 and 31. In regeneration control, the respective inverter receives AC electrical current from the electrical machine over transfer conductors 29 and 31 and supplies DC electrical current to the ESD 74 via electrical transmission line 27. A current monitoring system 30 is mechanized to monitor current flow through transmission line 27. The net DC current provided to or from the inverters determines the charge or discharge operating mode of the electrical energy storage device 74. Preferably, MG-A 56 and MG-B 72 are three-phase AC machines and the inverters comprise complementary three-phase power electronics.

Other elements of the control system depicted with reference to FIG. 1 comprise distributed control module architecture comprise a subset of an overall vehicle control architecture operable to provide coordinated system control of the vehicle powertrain system. The control system is operable to synthesize pertinent information and inputs, and execute algorithms to control various actuators to achieve control targets, including such parameters as fuel economy, emissions, performance, driveability, and protection of hardware, including batteries of ESD 74 and MG-A and MG-B 56, 72. The distributed control module architecture includes the engine control module ('ECM') 23, the transmission control module ('TCM') 17, battery pack control module ('BPCM') 21, and the Transmission Power Inverter Module ('TPIM') 19. The hybrid control module ('HCP') 5 provides overarching control and coordination of the aforementioned control modules. The UI 13 operably connected to a plurality of devices through which a vehicle operator typically controls or directs operation of the powertrain through a request for torque, including the transmission 10. Exemplary vehicle operator inputs to the UI 13 include an accelerator pedal, a brake pedal, transmission gear selector, and, vehicle speed cruise control. Each of the aforementioned control modules communicates with other control modules, sensors, and actuators via a local area network ('LAN') bus 6. The LAN bus 6 allows for structured communication of control parameters and commands between the various control modules. The specific communication protocol utilized is application-specific. The LAN bus and appropriate protocols provide for robust messaging and multi-control module interfacing between the aforementioned control modules, and other control modules providing functionality such as antilock brakes, traction control, and vehicle stability.

The HCP 5 provides overarching control of the hybrid powertrain system, serving to coordinate operation of the ECM 23, TCM 17, TPIM 19, and BPCM 21. Based upon various input signals from the UI 13 and the powertrain, including the battery pack, the HCP 5 generates various commands, including: operator torque, engine torque, clutch torque for the clutches of the transmission 10; and motor torque commands for MG-A and MG-B. The BPCM 21 is signally connected one or more sensors operable to monitor electrical current or voltage parameters of the ESD 74 to provide information about the state of the batteries to the HCP 5.

Each of the aforementioned control modules is preferably a general-purpose digital computer generally comprising a microprocessor or central processing unit, storage mediums comprising read only memory (ROM), random access memory (RAM), electrically programmable read only memory (EPROM), high speed clock, analog to digital (A/D) and digital to analog (D/A) circuitry, and input/output circuitry and devices (I/O) and appropriate signal conditioning and buffer circuitry. Each control module has a set of control algorithms, comprising resident program instructions and calibrations stored in ROM and executed to provide the respective functions of each computer. Information transfer between the various computers is preferably accomplished using the aforementioned LAN 6.

Algorithms for control and state estimation in each of the control modules are typically executed during preset loop cycles such that each algorithm is executed at least once each loop cycle. Algorithms stored in the non-volatile memory devices are executed by one of the central processing units and are operable to monitor inputs from the sensing devices and execute control and diagnostic routines to control operation of the respective device, using preset calibrations. Loop cycles are typically executed at regular intervals, for example each 3.125, 6.25, 12.5, 25 and 100 milliseconds during ongoing engine and vehicle operation. Alternatively, algorithms may be executed in response to occurrence of an event.

The electrical transmission line 27 between the ESD 74 and TPIM 27 is mechanized with the current monitoring system 30, comprising first and second current sensors. Each sensor is operative to monitor magnitude and direction of current flow to the ESD. Signal outputs from the current sensors of current monitoring system 30 are input to the TPIM, and are used to facilitate operations for monitoring the ESD 74, e.g. state-of-charge estimations. The first and second current sensors each preferably comprise known open-loop Hall-effect sensors operative to generate an electrical voltage output that is substantially proportional to the magnitude of current. The first sensor is preferably an open-loop Hall-effect sensor adapted to provide a linear output over a low current range of +/−30 amperes with an accuracy of about 1%, or 0.3 amperes. The second sensor is preferably an open-loop Hall-effect sensor adapted to provide a linear output over a high current range of +/−300 amperes with an accuracy of about 1%, or 3.0 amperes. In the control system mechanized with first and second current monitoring sensors, the control system preferably uses signal information from the first current sensor when the current level is between −30 amperes and approximately +30 amperes, and transitions to use signal information from the second current sensor when the current level is between approximately 30 amperes and 300 amperes. Sources of error in reading from the sensors include magnetic hysteresis at zero amperes and temperature drift. It is understood that the specifically described Hall-effect sensors are meant to be exemplary and not limiting. The substance of the disclosure is applicable to various types of current sensors.

Figure 2:
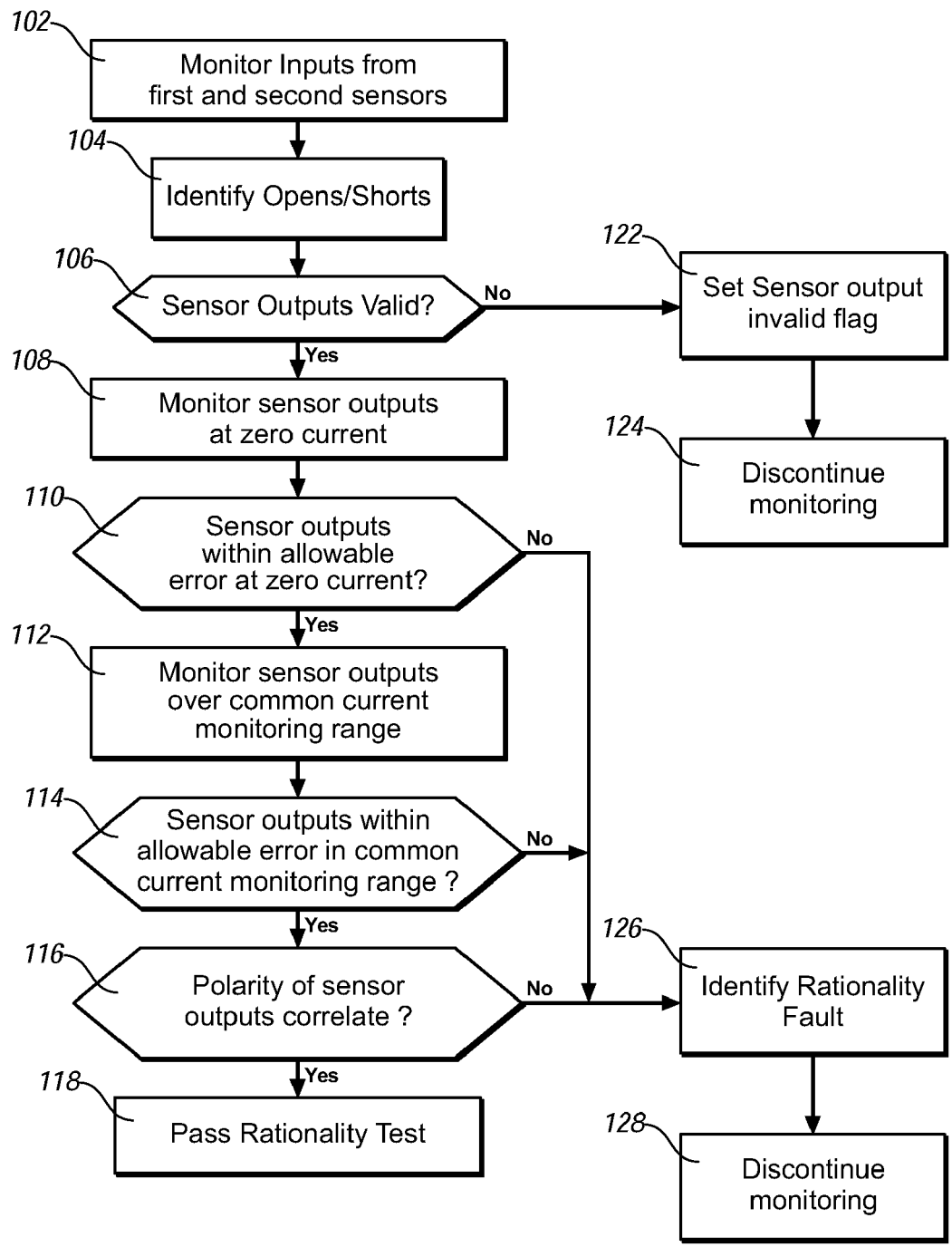

Referring now to FIG. 2, a flowchart is provided comprising a description of actions executed in the control system to monitor operation of the electrical current sensing system 30. The actions described herein are preferably executed as one or more algorithms resident in one of the distributed control modules, using predetermined calibrations. The disclosure is with reference to the aforementioned powertrain and control system, although it is understood that the disclosure is applicable to numerous systems which have a need to monitor operation of an electrical current monitoring device.

Initially, output signals from the first and second current sensors of the sensing system 30 are read, preferably through an I/O device of one of the control modules, e.g. the TPIM (Block 102). The output signals are analyzed to determine whether either output signal has been shorted to ground, or has an open electrical circuit due, e.g. to a break in an electrical wire (Block 104). This is preferably accomplished by the comparing the signal outputs to a system ground voltage and a system operating voltage. When it is determined that there is no open circuit or short circuit in the electrical system for the current sensors, the output signals are deemed valid (Block 106) and monitored during ongoing operation. Under a circumstance wherein it is determined that the output signals are not valid, e.g. presence of a short circuit or open circuit is found, then a fault is identified, a sensor_output_invalid flag is set (Block 122), and monitoring of the current sensing system is discontinued (Block 124).

Monitoring the output signals includes monitoring sensor output at zero current (Block 108). This can include measuring an initial value for zero current through the first and second sensors at initial key-on and startup of vehicle operation, prior to any command for electrical current. Furthermore, a zero-current output can be measured at other opportune times during operation when it is known that there is zero current flowing, such as when a circuit contactor is commanded opened. Each time a zero-current output is measured, the signals for zero-current output from the first and second sensors are compared (Block 110). When the output from one of the sensors is substantially different from the output from the other sensor, e.g. greater than a value of sensor error or measurement accuracy (1% of full-scale in this embodiment), a fault in sensor rationality is identified and captured (Block 126), and monitoring is discontinued (Block 128).

During ongoing operation of the vehicle, outputs from the first and second current sensors are regularly monitored and captured, in this embodiment at a sample rate of about 20 milliseconds (Block 112). When the magnitude of the current is within the linear monitoring ranges common to both the first sensor and the second sensor, i.e. between zero and thirty amperes in this embodiment, the magnitudes of the outputs of the first and second current sensors are compared (Block 114). A difference is determined between the outputs of the first and second sensors, and evaluated compared to measurement accuracies of the first and second sensors, which are predetermined and pre-calibrated in the control module. In this example, the measurement accuracy of the first sensor is 0.3 amperes and the measurement accuracy of the second sensor is 3.0 amperes. Therefore, a difference between of the outputs of the first and second current sensors that is less than 3.3 amperes is deemed acceptable in the exemplary system described herein. A difference greater than 3.3 amperes is deemed unacceptable, leading to identification of a fault, and, discontinuing further monitoring.

The polarities of the outputs from the first and second current sensors are determined and correlated (Block 116) Determining polarities of current outputs from the first and second current sensors preferably comprises monitoring current sensor output signals and voltage of the ESD 74 over an elapsed period of time. A direction of change in ESD voltage correlates to a knowable direction of change in sensed current. When the direction of change in sensed current from the first or second current sensor correlates to the change in ESD voltage, it can be determined that the current sensor has passed the polarity check (Block 118). When the direction of change in sensed current from the first or second current sensor does not correlate to the direct of change in ESD voltage, it can be determined that the current sensor has not passed the polarity check (Block 116), and there is a fault in the system. The fault in sensor rationality is identified and captured (Block 126), and monitoring is discontinued (Block 128).

When a fault is identified in the system, the control system is operable to act, such action including illuminating a malfunction indicator lamp in a vehicle instrument panel, disabling other related diagnostic algorithms, and implementing appropriate corrective actions in the control system, including such actions as necessary to prevent harm to other components.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. Method for monitoring a current sensing system operative to monitor electrical current in a transmission line between an electrical storage device and an electrical machine comprising:

providing a current sensing system comprising a first current sensor located between an electrical storage device and an electrical machine and linearly operative over a first range of electrical current to monitor a transmission line electrical current comprising an electrical current flowing between the electrical storage device and the electrical machine and to provide a first output of magnitude of the transmission line electrical current, and a second current sensor located between the electrical storage device and the electrical machine and linearly operative over a second range of electrical current that includes said first range of electrical current to monitor the transmission line electrical current and to provide a second output of magnitude of the transmission line electrical current; and receiving the first and second outputs at a control module, the control module being programmed to compare the first and second outputs of the magnitudes of the transmission line electrical current when the first and second outputs of the magnitudes of the transmission line electrical current are within said first range of electrical current and to output an indication of a first fault in the current sensing system when a difference between the first and second outputs of the magnitudes of the transmission line electrical current exceeds a summation of a first measurement accuracy of the first current sensor and a second measurement accuracy of the second current sensor.

2. The method of claim 1, wherein the control module is further programmed to determine whether the first and second outputs are valid by monitoring the first and second outputs and determining an absence of either of a short circuit and an open circuit in the first and second outputs.

3. The method of claim 2, wherein the control module is further programmed to identify a second fault in the current sensing system when either of the first and second outputs is invalid.

4. The method of claim 1, wherein the control module is further programmed to compare the first and second outputs when an open circuit is present in the transmission line, and to output an indication of a second fault in the current sensing system when either of the first and second outputs is not substantially zero.

5. The method of claim 1, wherein the control module includes a storage medium and the output indication of the first fault is stored in the storage medium.

6. The method of claim 1, wherein the first range of electrical current is different from the second range of electrical current.

7. The method of claim 1, wherein the output indication of the first fault is used to illuminate an indicator lamp.

8. The method of claim 1, wherein the first range of electrical current is approximately +/−30 amperes with a measurement accuracy of 0.3 amperes.

9. The method of claim 1, wherein the second range of electrical current is approximately +/−300 amperes with a measurement accuracy of 3.0 amperes.

10. Powertrain system, comprising:
   an electrical storage device electrically connected by a transmission line to an electrical machine operative to transmit motive torque to a vehicle driveline;
   a current sensing system operative to monitor a total electrical current flow between the electrical machine and the electrical storage device comprising a first current sensor located between the electrical storage device and the electrical machine and linearly operative over a first range of electrical current to monitor the total electrical current flow and to provide a first output of magnitude and direction of the total electrical current flow and a second current sensor located between the electrical storage device and the electrical machine and linearly operative over a second range of electrical current that includes said first range of electrical current to monitor the magnitude and the direction of the total electrical current flow and to provide a second output of magnitude and direction of the total electrical current flow;
   a control system:
      adapted to monitor the electrical storage device and control the electrical machine; and
      including a control module comprising a storage medium having a computer program encoded therein, the program being executed by the control module to monitor operation of the current sensing system, the program comprising:
         code for identifying a fault in the current sensing system based upon the first and second outputs of the magnitudes of the total electrical current flow;
         code for providing an output indicating the identified fault in the current sensing system.

11. The powertrain system of claim 10, wherein the code for identifying a fault in the current sensing system further includes:
   code for monitoring voltage in the electrical storage device during an elapsed time period;
   code for comparing a direction of change in the monitored voltage of the electrical storage device to a direction of change in the first and second outputs; and
   code for identifying a fault in the current sensing system when the direction of change in either of the first and second outputs does not correlate to the direction of change in the monitored voltage of the electrical storage device.

12. The powertrain system of claim 10, wherein the code for identifying a fault in the current sensing system further includes:
   code for monitoring the first and second outputs during a zero current flow through the transmission line; and
   code for identifying a fault in the current sensing system when either of the first and second outputs of the magnitudes of the total electrical current flow is not substantially zero during the zero current through the transmission line.

13. The powertrain system of claim 10, wherein the code for identifying a fault in the current sensing system further includes:
   code for comparing the first and second outputs of the magnitudes of the total electrical current flow when the monitored total electrical current flow is within the first range of electrical current;
   code for determining a difference between the first and second outputs of the magnitudes of the total electrical current flow; and
   code for identifying a fault when the difference between the first and second outputs of the magnitudes of the total electrical current flow exceeds a summation of a first measurement accuracy of the first current sensor and a second measurement accuracy of the second current sensor.

* * * * *